(12) United States Patent
Allison et al.

(10) Patent No.: US 10,069,481 B2
(45) Date of Patent: Sep. 4, 2018

(54) STATE CHANGE STABILIZATION IN A PHASE SHIFTER/ATTENUATOR CIRCUIT

(71) Applicant: pSemi Corporation, San Diego, CA (US)

(72) Inventors: Matt Allison, Oceanside, CA (US); Eric S. Shapiro, San Diego, CA (US)

(73) Assignee: pSemi Corporation, San Diego, CA (US)

( * ) Notice: Subject to any disclaimer, the term of this patent is extended or adjusted under 35 U.S.C. 154(b) by 0 days.

(21) Appl. No.: 15/839,676

(22) Filed: Dec. 12, 2017

(65) Prior Publication Data

US 2018/0212591 A1 Jul. 26, 2018

Related U.S. Application Data

(63) Continuation of application No. 15/462,702, filed on Mar. 17, 2017, now Pat. No. 9,906,208, which is a continuation of application No. 14/752,353, filed on Jun. 26, 2015, now Pat. No. 9,634,650.

(51) Int. Cl.
*H03K 3/00* (2006.01)
*H03H 11/20* (2006.01)
*H03H 11/24* (2006.01)

(52) U.S. Cl.
CPC ............ *H03H 11/20* (2013.01); *H03H 11/24* (2013.01)

(58) Field of Classification Search
None
See application file for complete search history.

(56) References Cited

U.S. PATENT DOCUMENTS

| | | | |
|---|---|---|---|
| 4,978,932 A | 12/1990 | Ramesh et al. | |
| 6,104,986 A | 8/2000 | Arevalo | |
| 7,082,171 B1* | 7/2006 | Johnson | H03D 7/00 375/260 |
| 7,567,611 B2* | 7/2009 | Chien | H04B 1/30 375/219 |
| 7,672,368 B2* | 3/2010 | Agazzi | G01R 31/3004 375/229 |

(Continued)

FOREIGN PATENT DOCUMENTS

| | | |
|---|---|---|
| EP | 2337219 | 6/2011 |
| EP | 2621087 | 7/2013 |

(Continued)

OTHER PUBLICATIONS

Almo, Khareem E., Notice of Allowance received from the USPTO dated Aug. 28, 2017 for U.S. Appl. No. 15/462,702, 3 pgs.

(Continued)

*Primary Examiner* — Lincoln Donovan
*Assistant Examiner* — Khareem E Almo
(74) *Attorney, Agent, or Firm* — Jaquez Land Greenhaus LLP; Martin J. Jaquez, Esq.; John Land, Esq.

(57) ABSTRACT

An electronic system that includes a digitally selectable phase shifter circuit and an insertion loss fine adjustment circuit such that the system as a whole exhibits little or no change in insertion loss when changing phase state, and/or a digitally selectable attenuator circuit and a phase fine adjustment circuit such that the system as a whole exhibits little or no effect on phase when changing attenuation state. Included are methods for selecting adjustment control words for such circuits.

19 Claims, 8 Drawing Sheets

(56) References Cited

U.S. PATENT DOCUMENTS

| | | | | |
|---|---|---|---|---|
| 8,275,071 | B2* | 9/2012 | Shen | H03D 3/007 375/316 |
| 8,933,727 | B1* | 1/2015 | Liu | G01S 7/03 326/82 |
| 9,148,144 | B1* | 9/2015 | Liu | G01S 7/03 |
| 9,634,650 | B2 | 4/2017 | Allison et al. | |
| 9,906,208 | B2 | 2/2018 | Allison et al. | |
| 2009/0085645 | A1* | 4/2009 | Tanaka | H04B 1/0003 327/407 |
| 2012/0286839 | A1* | 11/2012 | Park | H03F 3/193 327/240 |
| 2016/0380623 | A1 | 12/2016 | Allison et al. | |
| 2017/0302253 | A1 | 10/2017 | Allison et al. | |

FOREIGN PATENT DOCUMENTS

| | | |
|---|---|---|
| EP | 3314759 | 5/2018 |
| JP | S58134502 | 8/1983 |

OTHER PUBLICATIONS

Almo, Khareem E., Notice of Allowance received from the USPTO dated Nov. 29, 2017 for U.S. Appl. No. 15/462,702, 3 pgs.

Allison, et al., Preliminary Amendment filed in the USPTO dated Oct. 6, 2017 for U.S. Appl. No. 15/462,702, 3 pgs.

Almo, Khareem E., Office Action received from the USPTO dated Jul. 26, 2016 for U.S. Appl. No. 14/752,353, 19 pgs.

Almo, Khareem E., Notice of Allowance received from the USPTO dated Mar. 9, 2017 for U.S. Appl. No. 14/752,353, 18 pgs.

Allison, et al., Response filed in the USPTO dated Oct. 28, 2016 for U.S. Appl. No. 14/752,353, 12 pgs.

Peregrine Semiconductor Corporation, Demand and Amendment filed in the EPO dated Apr. 21, 2017 for appln. No. PCT/US2016/032559, 28 pgs.

Chao, et al., "Development of Multiband Phase Shifters in 180-nm RF CMOS Technology with Active Loss Compensation", IEEE Transactions on Microwave Theory and Techniques, vol. 54, No. 1, Jan. 2006, pp. 40-45.

Trafidlo, Reneata, Written Opinion of the International Preliminary Examining Authority received from the EPO dated Sep. 11, 2017 for appln. No. PCT/US2016/032559, 16 pgs.

Comia Costa, Marta, International Preliminary Report on Patentability received from the EPO dated Nov. 21, 2017 for appln. No. PCT/US2016/032559, 37 pgs.

Ku, et al., "6-bit CMOS Digital Attenuators with Low Phase Variations for X-Band Phased-Array Systems", IEEE Transactions on Microwave Theory and Techniques, vol. 58, No. 7, Jul. 2010, pp. 1651-1663.

Ellinger, et al., "Integrated Adjustable Phase Shifters", IEEE Microwave Magazine, Oct. 2010, pp. 97-108.

European Patent Office, Communicatio pursuant to Rules 151(1) and 162 EPC received from the EPO dated Feb. 2, 2018 for appln. No. 16744920.6, 3 pgs.

* cited by examiner

STATE CHANGE STABILIZATION IN A PHASE SHIFTER/ATTENUATOR CIRCUIT

CROSS REFERENCE TO RELATED APPLICATIONS—CLAIMS OF PRIORITY

The present application is a continuation of U.S. application Ser. No. 15/462,702 entitled "State Change Stabilization in a Phase Shifter/Attenuator Circuit", filed on Mar. 17, 2017, the disclosure of which is incorporated herein by reference in its entirety; application Ser. No. 15/462,702 is a continuation of U.S. application Ser. No. 14/752,353 entitled "State Change Stabilization in a Phase Shifter/Attenuator Circuit", filed on Jun. 26, 2015, now U.S. Pat. No. 9,634,650 issued Apr. 25, 2017, the disclosure of which is incorporated herein by reference in its entirety.

BACKGROUND

(1) Technical Field

This invention relates to electronic circuitry, and more particularly to digitally selectable phase shifter and/or digitally selectable attenuator circuits.

(2) Background

Electronic phase shifter circuits are used to change the transmission phase angle of a signal, and are commonly used to phase shift radio frequency (RF) signals. Modern phase shifter circuits may be digitally controlled and thus provide a discrete set of phase states that are selected by a binary control word. Some phase shifter circuits also include a digitally controlled RF signal attenuator circuit that provides a discrete set of attenuation states that are selected by a binary control word.

Figure 1:
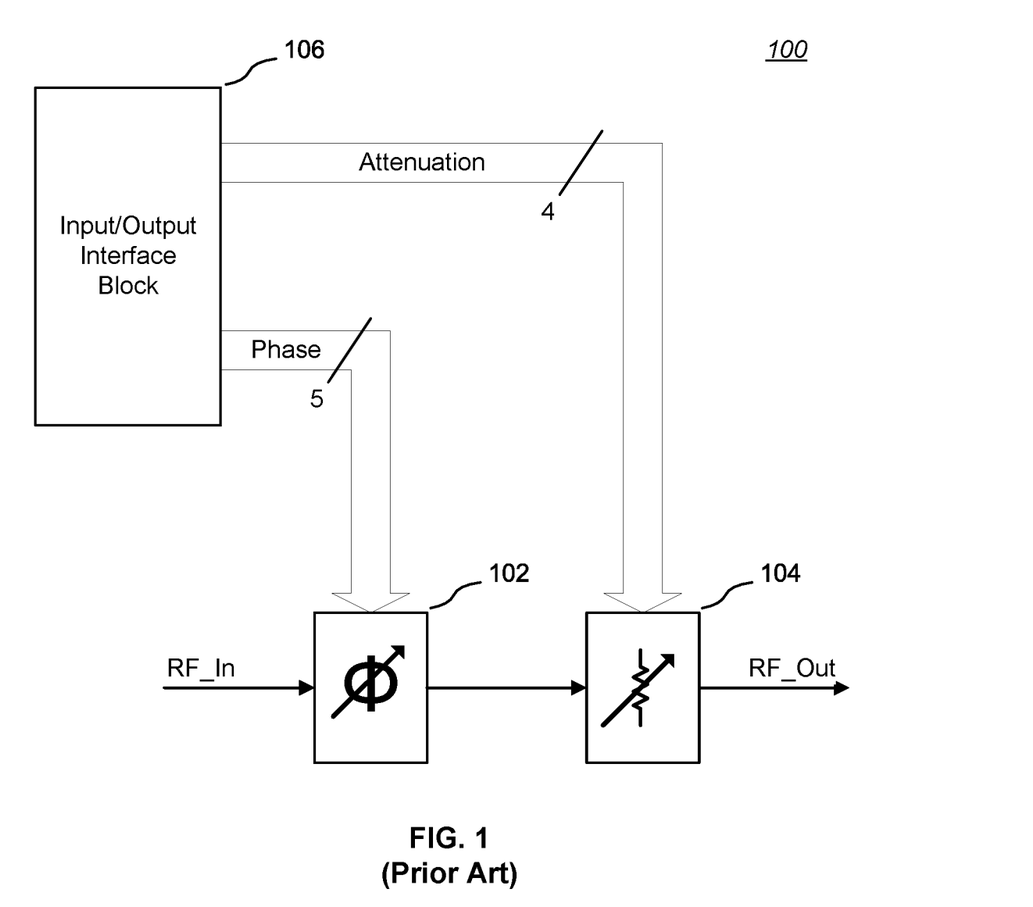
FIG. 1 is a block diagram of a prior art electronic system that includes a selectable phase shifter circuit coupled to a selectable attenuator circuit and an input/output interface block.

FIG. 1 is a block diagram of a prior art electronic system 100 that includes a selectable phase shifter circuit 102 coupled to a selectable attenuator circuit 104 and an input/output interface 106. The selectable phase shifter circuit 102 and the selectable attenuator circuit 104 modify an RF input signal, RF_In, to generate an RF output signal, RF_Out. The illustrated embodiment may be useful, for example, in radar systems, phased array antenna systems, and cellular radio transmitters and receivers.

The input/output interface 106 allows user selection of particular phase states in the phase shifter circuit 102 and attenuation states in the attenuator circuit 104 by application of digital controls words to the respective circuits, in known manner. As one example, a 5-bit control word for phase may select one of 32 phase states for the selectable phase shifter circuit 102, and a 4-bit control word for attenuation may select one of 16 attenuation states for the selectable attenuator circuit 104. A commercial example of a similar circuit is the PE46120 Monolithic Phase and Amplitude Controller product from Peregrine Semiconductor Corporation.

Figure 2:
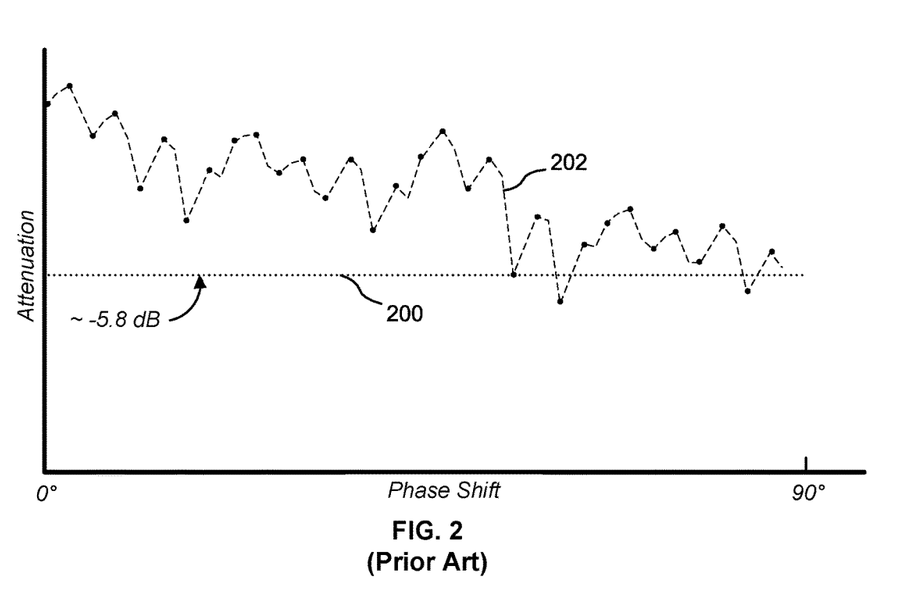
FIG. 2 is a graph of one simulation of a phase shifter circuit showing the variability of insertion loss as a function of phase state selection.

Ideal phase shifter circuits provide low insertion loss and equal amplitude (or loss) in all phase states. Ideal phase shifter circuits also should operate independent of attenuation, changing only the phase of an input signal with no effect on insertion loss. However, actual phase shifter circuits have an inherent and unwanted variability of insertion loss that depends on the selected phase state. For example, FIG. 2 is a graph of one simulation of a digital phase shifter circuit showing the variability of insertion loss (in dB, measured relative to a target value of about −5.8 dB, shown by a dotted line 200) as a function of phase state selection (each state is designated by a dot on the dashed line 202). The insertion loss variability is due to internal component and path differences within a phase shifter circuit as different phase shifting circuit components are switched in or out of the signal path, as well as impedance differences between binary components and/or impedance changes in the aggregate path of the RF signal.

Similarly, ideal attenuator circuits should operate independent of phase shifts, changing only the attenuation of an input signal with no effect on phase. However, actual attenuator circuits may cause unwanted phase variations that depend on the selected attenuation state.

The above problems become particularly acute as the number of state selection bits and corresponding internal interactions increases.

Accordingly, there is a need for a phase shifter circuit that exhibits little or no effect on insertion loss when changing phase state, and a method for calibrating and selecting phases states for such a circuit. There is also a need for an attenuator circuit that exhibits little or no effect on phase when changing attenuation state, and a method for calibrating and selecting attenuation states for such a circuit. The present invention addresses these needs.

SUMMARY OF THE INVENTION

The present invention comprises an electronic system that includes a digitally selectable phase shifter circuit and an insertion loss fine adjustment circuit such that the system as a whole exhibits little or no insertion loss variation when changing phase state, and a method for calibrating and selecting phases states for such a system. The present invention further comprises an electronic system that includes a digitally selectable attenuator circuit and a phase fine adjustment circuit such that the system as a whole exhibits little or no effect on phase when changing attenuation state, and a method for calibrating and selecting attenuation states for such a system. Also encompassed within the invention is a combination of a digitally selectable phase shifter circuit, a digitally selectable attenuator circuit, and a fine adjustment circuit that provides selectable state change stabilization for either or both of such circuits.

In particular, to minimize insertion loss variability in an electronic system that includes a digitally selectable phase shifter circuit, small selectable attenuators are coupled to the phase shifter circuit. Insertion loss variability between selected phase states is minimized by selectively adding small losses (levels of attenuation) to those phase states having better insertion loss so as to substantially equalize insertion loss across all phases states. Optionally, a bias may be applied to all phase states so as to make available "negative" attenuation levels, thereby allowing a varying amount of attenuation as needed to move pre-adjustment phase state insertion losses closer to a post-adjustment insertion loss target value.

Similarly, to minimize phase variability in an electronic system that includes a digitally selectable attenuator circuit, small selectable phase shifters are coupled to the attenuator circuit. Phase variability between selected attenuation states is minimized by selectively adding small phase adjustments to attenuation states exhibiting phase shifts so as to substantially equalize phase across all attenuation states.

A calibration process maps each phase and/or attenuation state to a desired level of compensating attenuation or phase (which may be zero in some cases). The compensating phase and attenuation settings for a fine adjustment circuit may be stored in a look-up table (e.g., a read-only memory, or a set of settable switches or fuses, or a hard-coded metallization layer) that encodes such settings as fixed values mapped to corresponding phase state or attenuation state control words. In addition, some embodiments of the invention allow the level of adjustment produced by the fine adjustment circuit to be selectably programmed by a user.

The details of one or more embodiments of the invention are set forth in the accompanying drawings and the description below. Other features, objects, and advantages of the invention will be apparent from the description and drawings, and from the claims.

DESCRIPTION OF THE DRAWINGS

Like reference numbers and designations in the various drawings indicate like elements.

DETAILED DESCRIPTION OF THE INVENTION

The present invention comprises an electronic system that includes a digitally selectable phase shifter circuit and an insertion loss fine adjustment circuit such that the system as a whole exhibits little or no effect on insertion loss when changing phase state, and a method for calibrating and selecting phases states for such a system.

The present invention further comprises an electronic system that includes an attenuator circuit and a phase fine adjustment circuit such that the system as a whole exhibits little or no effect on phase when changing attenuation state, and a method for calibrating and selecting attenuation states for such a system.

In particular, to minimize insertion loss variability in an electronic system that includes a digitally selectable phase shifter circuit, small selectable attenuators are coupled to the phase shifter circuit. Insertion loss variability between selected phase states is minimized by selectively adding small losses (levels of attenuation) to those phase states having better insertion loss so as to substantially equalize insertion loss across all phase states. Optionally, a bias may be applied to all phase states so as to make available "negative" attenuation levels, thereby allowing a varying amount of attenuation as needed to move pre-adjustment phase state insertion losses closer to a post-adjustment insertion loss target value. In some embodiments, variability between selected phase states may be corrected by selectively applying small amounts of gain adjustments rather than attenuation adjustments; gain adjustments may be thought of as "negative" attenuation adjustments. Further, a combination of gain and attenuation adjustments may be used to correct such phase variability.

Similarly, to minimize phase variability in an electronic system that includes a digitally selectable attenuator circuit, small selectable phase shifters are coupled to the attenuator circuit. Phase variability between selected attenuation states is minimized by selectively adding small phase adjustments to attenuation states exhibiting phase shifts so as to substantially equalize phase across all attenuation states.

A calibration process maps each phase and/or attenuation state to a desired level of compensating attenuation or phase (which may be zero in some cases). The compensating phase and attenuation settings for a fine adjustment circuit may be stored in a look-up table (e.g., a read-only memory, or a set of settable switches or fuses, or a hard-coded metallization layer) that encodes such settings as fixed values mapped to corresponding phase state or attenuation state control words. In addition, some embodiments of the invention allow the level of adjustment produced by the fine adjustment circuit to be selectably programmed by a user.

Embodiments of the invention are particularly useful as the number of state selection bits and corresponding internal interactions increases.

Phase State Adjustment Embodiment

Figure 3:
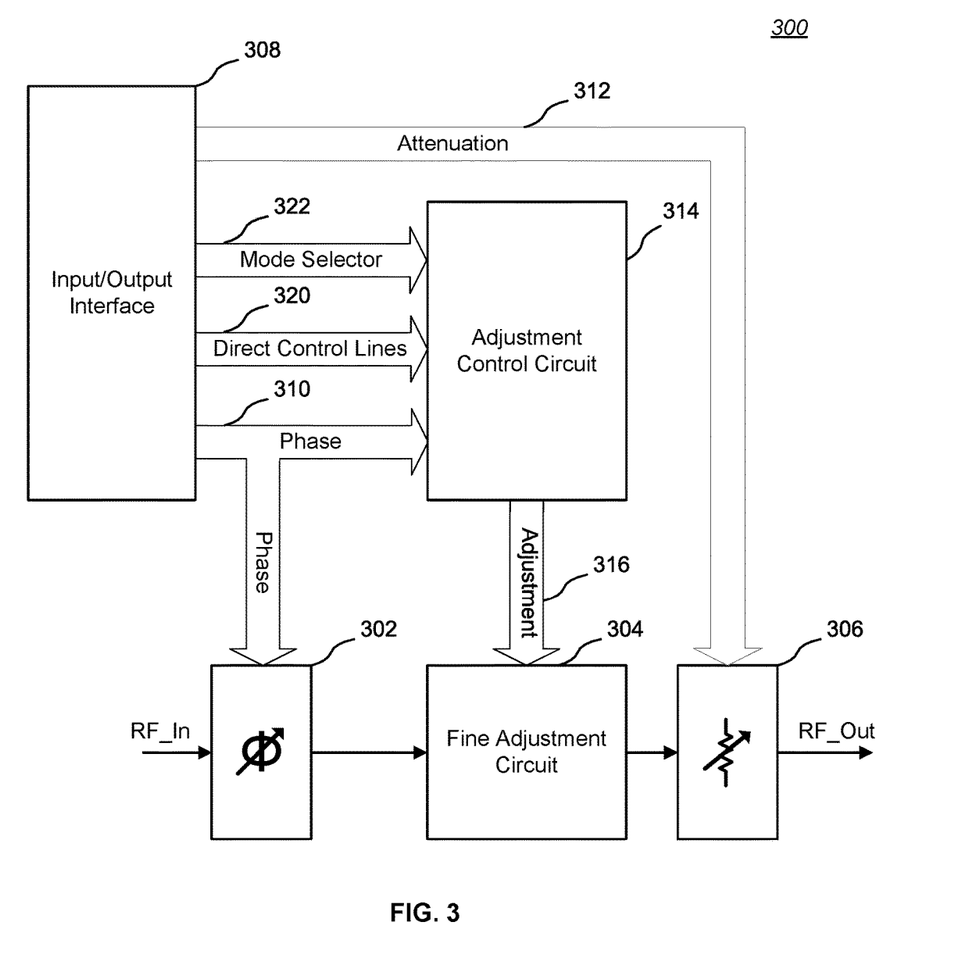
FIG. 3 is a block diagram showing a phase state adjustment embodiment of the invention.

FIG. 3 is a block diagram showing a phase state adjustment embodiment 300 of the invention. In the illustrated embodiment, a selectable phase shifter circuit 302 is coupled to an RF input signal, RF_In, and the output of the selectable phase shifter circuit 302 is coupled to an fine adjustment circuit 304. The output of the fine adjustment circuit 304 is coupled to a selectable attenuator circuit 306, the output of which is RF_Out, a modified form of the RF_In signal.

The selectable phase shifter circuit 302 and the selectable attenuator circuit 306 are both coupled to corresponding control word lines from an input/output interface 308. The input/output interface 308 serves as an interface for communication with external circuitry, for example, by means of the well-known serial peripheral interface (SPI) serial bus. The phase states and attenuation levels may be specified by external circuitry via such a serial interface. The input/output interface 308 converts the specified states and levels to control words, conveyed by a phase bus 310 and an attenuation bus 312, for selecting a respective phase state for the selectable phase shifter circuit 302 and an attenuator state the selectable attenuator circuit 306. The width of the control words (e.g., 4 bits, 5 bits) is a matter of design choice.

The illustrated embodiment also includes an adjustment control circuit 314. One input to the illustrated adjustment control circuit 314 is the phase control word from the phase bus 310. In response to a phase control word value, the adjustment control circuit 314 outputs an adjustment control word on a corresponding bus 316 to the fine adjustment circuit 304.

The illustrated fine adjustment circuit 304 is functionally similar to the selectable attenuator circuit 306, except that the level of selectable attenuation is very fine. For example, for a 3-bit adjustment control word that allows selection of any of 8 combinations of attenuation levels (including zero attenuation), the illustrated fine adjustment circuit 304 may include three stages of fine attenuators: 0.05 dB, 0.1 dB, and 0.2 dB (in contrast, a typical selectable attenuator circuit 306 has a minimum attenuation value of about 0.5 dB). It has been found that differences in insertion loss caused by different selected phase states can generally be compensated by some combination of such fine values, in general, with an attenuation resolution (i.e., attenuation step size) of less than about 0.5 dB, and typically less than about 0.5 dB of total available adjustment attenuation.

As a more specific example, a 3-bit adjustment control word can be mapped to and control 0.05 dB, 0.1 dB, and 0.2 dB attenuators in accordance with the following Table 1:

TABLE 1

| bit2<br>0.2 dB | bit1<br>0.1 dB | bit0<br>0.05 dB | Total Attenuation Level<br>(dB) |
| --- | --- | --- | --- |
| 0 | 0 | 0 | 0.0 |
| 0 | 0 | 1 | 0.05 |
| 0 | 1 | 0 | 0.1 |
| 0 | 1 | 1 | 0.15 |
| 1 | 0 | 0 | 0.2 |
| 1 | 0 | 1 | 0.25 |
| 1 | 1 | 0 | 0.3 |
| 1 | 1 | 1 | 0.35 |

Figure 4A:
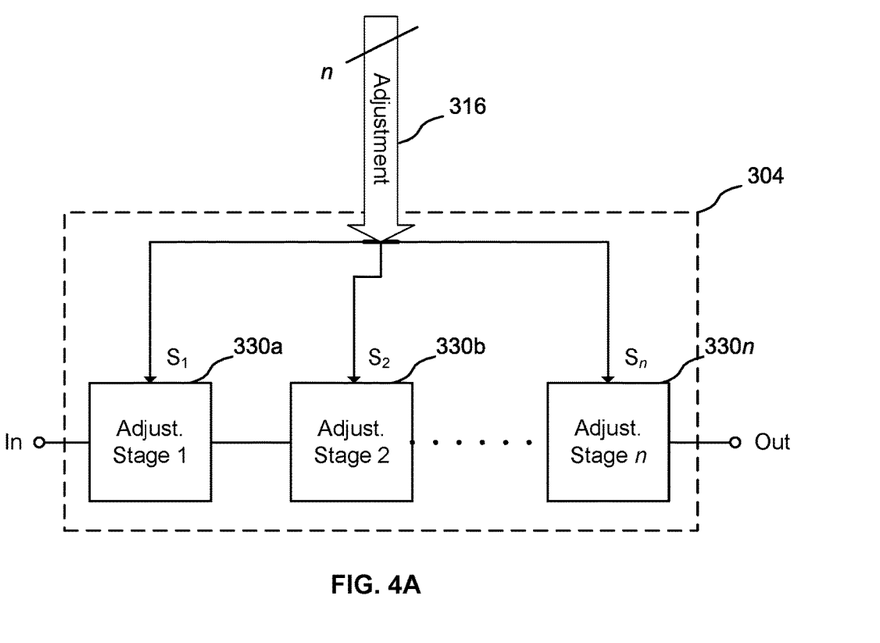
FIG. 4A is a block diagram of one embodiment of a fine adjustment circuit.
Figure 4B:
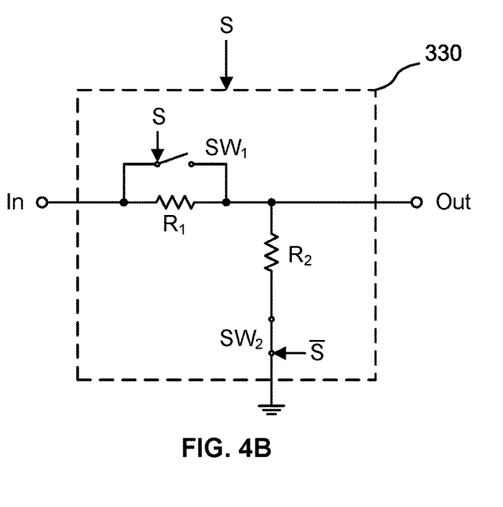
FIG. 4B is a schematic diagram of an "L-pad" attenuator circuit suitable for use as an adjustment stage.

FIG. 4A is a block diagram of one embodiment of a fine adjustment circuit 304. Shown are "n" attenuator adjustment stages 330a-330n coupled by corresponding selection lines $S_1$-$S_n$ to an n-bit adjustment control word conveyed by a corresponding adjustment bus 316. The internal structure of the adjustment stages 330a-330n is a matter of design choice. For example, FIG. 4B is a schematic diagram of an "L-pad" attenuator circuit 330 suitable for use as an adjustment stage 330a-330n. The L-pad attenuator circuit 330 basically consists of a switchable (2-state) voltage divider circuit formed by two resistors, $R_1$ and $R_2$, connected as shown. To turn the attenuator circuit 330 ON (attenuation mode), bypass switch $SW_1$ is opened and shunt switch $SW_2$ is closed in response to receipt of a corresponding control signal S or $\overline{S}$, resulting in a conventional "L-pad" type attenuator configuration with the input signal propagating from an In port to an Out port (the $SW_1$ and $SW_2$ switches are shown in the attenuation mode configuration). The amount of attenuation and/or reflection is a function of $R_1$ and $R_2$, as is known in the art. To turn the attenuator circuit 330 OFF, bypass switch $SW_1$ is closed and shunt switch $SW_2$ is opened, shunting the input signal around switch $SW_1$ and effectively bypassing the attenuator circuit 330.

Figure 4C:
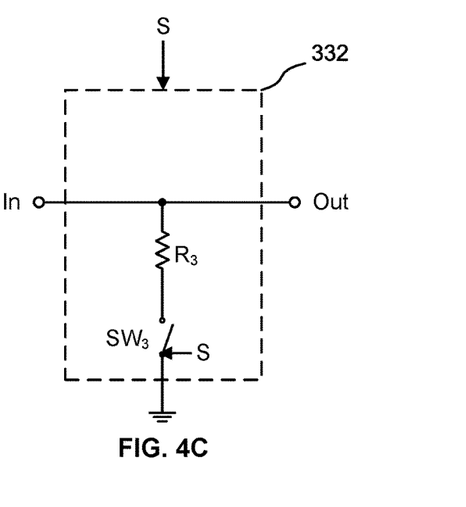
FIG. 4C is a schematic diagram of an shunt-switched resistor attenuator circuit suitable for use as an adjustment stage.

The attenuation characteristics of an "L-pad" type attenuator are well known to those skilled in the art. Other attenuator circuits may also be used, such as a "pi" type attenuator or a "bridged T" type attenuator, and such circuits may include a combination of active and/or passive components. Another method of introducing small amounts of attenuation is to use a shunt-switched resistor. FIG. 4C is a schematic diagram of an shunt-switched resistor attenuator circuit 332 suitable for use as an adjustment stage. A resistor $R_3$ and a switch $SW_3$ are connected as shown. To turn the attenuator circuit 332 ON (attenuation mode), shunt switch $SW_3$ is closed in response to receipt of a corresponding control signal S with an "ON" state (e.g., binary 1). To turn the attenuator circuit 332 OFF (non-attenuation mode), shunt switch $SW_3$ is opened in response to receipt of a corresponding control signal S with an "OFF" state (e.g., binary 0). As is known in the art, in the attenuation mode, a shunt-switched resistor introduces a small amount of attenuation by essentially dissipating and reflecting a small amount of an input signal, thereby causing a small impedance mismatch.

While a binary weighted set of adjustment stages 330a-330n is shown in FIG. 4A, other weighting schemes may be used, including a linear "thermometer" type attenuation circuit. In addition, while the adjustment stages 330a-330n are shown series connected, equivalent functionality can be achieved by switching one or more of "n" parallel attenuators into series between the In and Out ports. Various hybrid series-and-parallel equivalent circuits may also be used so as to selectively switch in a fine adjustment attenuation level into the RF signal path in order to offset changes in insertion loss as phase state varies.

In alternative embodiments, variability between selected phase states may be corrected by selectively applying small amounts of gain adjustments rather than attenuation adjustments; gain adjustments may be thought of as "negative" attenuation adjustments. Further, a combination of gain (negative attenuation) and attenuation adjustments may be used to correct such phase variability. The challenge and trade-off in using gain adjustments include designing amplifying stages that maintain reasonably linearity and dealing with greater current consumption; nevertheless, use of gain (negative attenuation) adjustments may be useful for some applications. However, in general, an advantage of adding positive attenuation (rather than negative attenuation in the form of gain) is less degradation of linearity and lower current consumption.

In a simple form, the adjustment control circuit 314 simply maps an input phase selection control word from the phase bus 310 to an adjustment control word for output to the fine adjustment circuit 304. A calibration process maps each phase state to a desired level of compensating attenuation (which may be zero in some cases). The compensating attenuation settings for the insertion loss fine adjustment circuit may be stored in a look-up table (e.g., a read-only memory, or a set of settable switches or fuses, or a combinational logic decoder hard-coded by means of a metallization layer) that encodes such settings as fixed values mapped to corresponding phase state control words. In addition, some embodiments of the invention allow the level of attenuation produced by the insertion loss fine adjustment circuit to be selectably programmed by a user.

Figure 5:
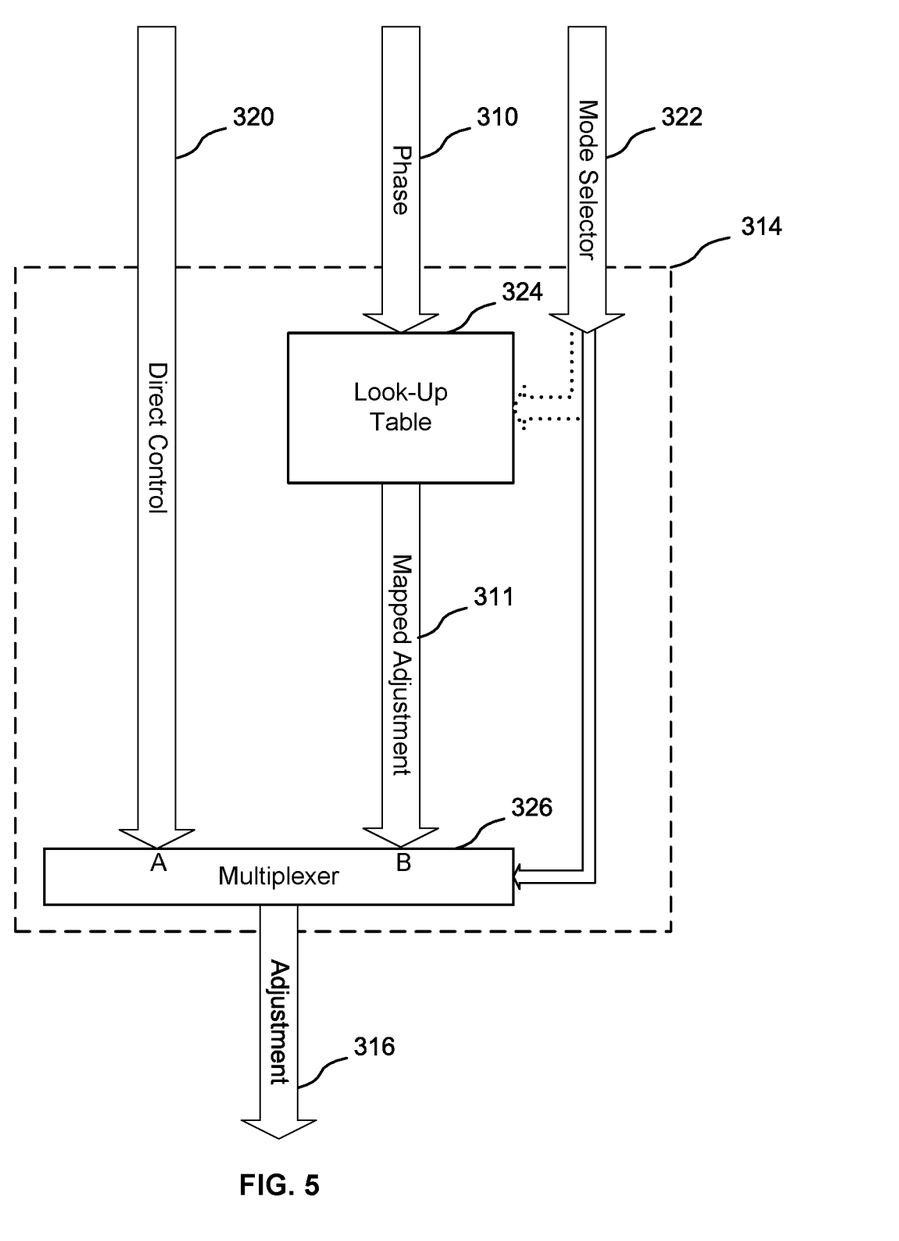
FIG. 5 is a block diagram of one embodiment of an adjustment control circuit.

FIG. 5 is a block diagram of one embodiment of an adjustment control circuit 314. In addition to receiving phase selection control words from the input/output interface 308 by means of a corresponding phase bus 310, the adjustment control circuit 314 similarly receives phase selection control words over a direct control bus 320, and also receives a mode selector signal 322 (a line or bus). The phase bus 310 is coupled to a look-up table 324 that maps particular phase selection control words to corresponding adjustment control words conveyed by a mapped adjustment bus 311. The direct control bus 320 conveys adjustment control words provided by a user's system through the input/output interface 308, for example, through dynamically programmed control circuitry (not shown) or from an external look-up table. This feature may be useful when a customer wishes to map phase control words to adjustment control words in a final system configuration to take into account all influences on the selectable phase shifter circuit 302 (e.g., adjacent circuitry, ground planes on circuit boards, etc.).

The mode selector signal 322 is coupled to a bus multiplexer 326 and selects either the mapped adjustment bus 311 from the look-up table 324 or the direct control bus 320 as the output of the adjustment control circuit 314. In some embodiments, the mode selector signal 322 may also be coupled (shown with dotted lines) to the look-up table 324 so as to select one of "N" mappings of phase control words to adjustment control words. Thus, for example, if the look-up table 324 comprises multiple "pages" (e.g., 8 pages) of memory locations that map input control words to output control words, then different pages can be selected by a mode selector signal 322 of appropriate width (e.g., 3-bits) under external program control. This feature may be useful in a variety of ways; for example, the behavior of the selectable phase shifter circuit 302 may be known to vary depending on specific environmental factors (e.g., ambient or circuit temperature, integrated circuit fabrication process variation), system configuration, or input signal frequency, and accordingly different mappings of input phase selection control words to adjustment control words may be appropriate at different times or under different conditions.

Phase State Control Word to Adjustment Control Word Mapping

Mapping of phase control words to adjustment control words may be done in several ways, to the same end: selecting an amount of attenuation for each phase state so that phase states having better insertion loss are attenuated more than phase states have worse insertion loss, in order to substantially equalize insertion loss across all phase states.

Figure 6:
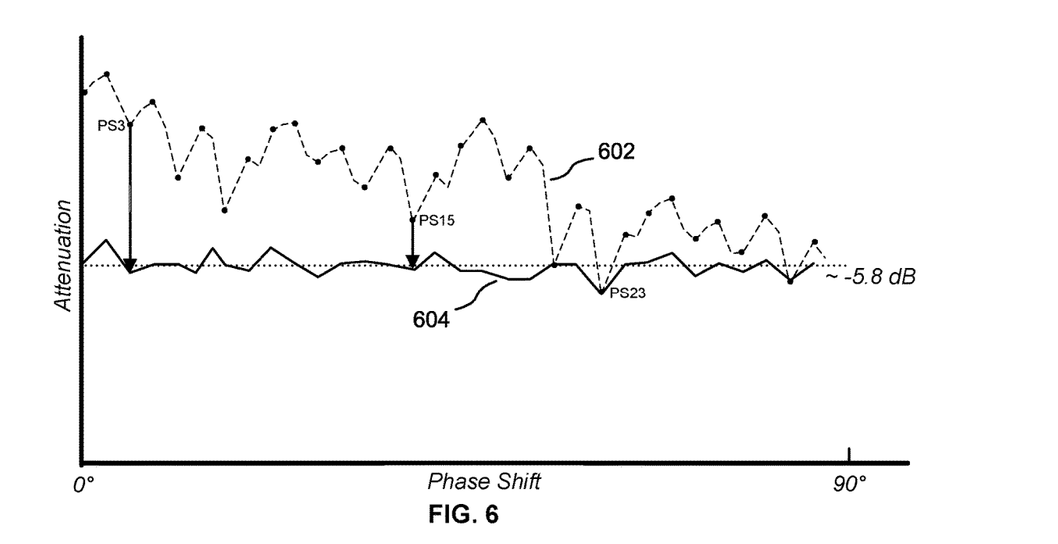
FIG. 6 shows a first graph of one simulation of a phase shifter circuit showing the variability of insertion loss as a function of phase state selection (pre-adjustment), and a second graph of insertion loss as a function of phase state selection after select amounts of attenuation have been applied (post-adjustment).

For example, FIG. 6 shows a first graph 602 of one simulation of a phase shifter circuit showing the variability of insertion loss as a function of phase state selection (pre-adjustment), and a second graph 604 of insertion loss as a function of phase state selection after select amounts of attenuation have been applied (post-adjustment). The amount of pre-adjustment insertion loss for phase state 3 (PS3) is less than the insertion loss for phase state 15 (PS15). Accordingly, more attenuation is needed for phase state 3 than for phase state 15 in order to "flatten" the pre-adjustment graph 602 to be like the post-adjustment graph 604.

In general, the amount of attenuation needed for each phase state selection will vary and may be determined empirically during a calibration stage of component manufacture. For example, an integrated circuit embodiment of the invention can be tested against different values of adjustment control words at each phase state, and the value of the adjustment control word at each phase state that best achieves a desired level of insertion loss may be selected and stored in a look-up table. One efficient method of testing is to apply a binary search pattern (also known as a half-interval search algorithm). For a 3-bit adjustment word, only 3 tests need be made to find the best attenuation level among the 8 possible states, starting with a middle value. For example, referring to Table 1 above, testing could start with a binary adjustment value of "100" (corresponding to 0.2 dB in this example), and move up or down the table of values by about one-half of the difference between a current value (e.g., "100") and the next applicable range of values. Thus, if an adjustment value of "100" is too little attenuation, then test the value halfway between "100" and "111" (i.e., "110"); if "110" is too much attenuation, then test the value halfway between "110" and "100" (i.e., "101").

It should be noted that the insertion loss for some pre-adjustment phase states may be worse than a desired target value (e.g., about −5.8 dB in the illustrated example). Hence, in some embodiments, it may be desirable to apply a "negative" attenuation that lessens the insertion loss for such phase states. This may be accomplished by selecting a combination of the adjustment control word bits that applies a "middle" amount of attenuation (i.e., a bias) to all phase states, thereby allowing a varying amount of attenuation as needed to move pre-adjustment phase state insertion losses closer to a post-adjustment insertion loss target value. For example, referring to Table 1 above, all phase states may be initially attenuated by 0.15 dB (adjustment control word value 011 in this example) so that more or less attenuation can be applied to adjust the insertion loss occurring at each phase state closer to a target value. As an alternative, as noted above, small amounts of gain adjustments may be used to the same end.

Figure 7A:
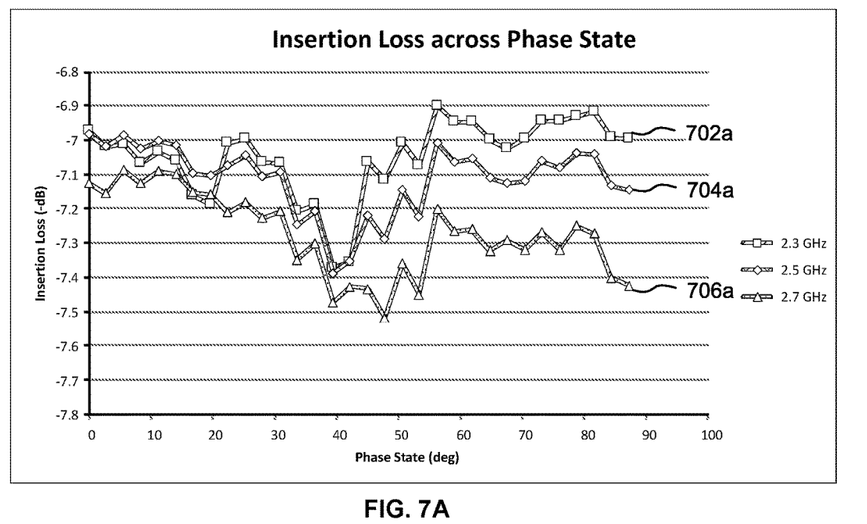
FIG. 7A is a set of graphs for a particular simulation of a phase shifter circuit showing the pre-adjustment variability of attenuation as a function of phase state selection and frequency, illustrating the degree of compensation per phase state needed to equalize insertion loss.

FIG. 7A is a set of graphs for a particular simulation of a phase shifter circuit showing the pre-adjustment variability of attenuation as a function of phase state selection and frequency (graph lines 702*a*, 704*a*, 706*a*), illustrating the degree of compensation per phase state needed to equalize insertion loss. In this figure (and in FIG. 7B below), insertion loss (in dB) is plotted against individual phase states 0 to 31, corresponding to respective phase shifts of 2.8° to 87.2° in this example. Each graph line 702*a*, 704*a*, 706*a* representing an individual frequency. FIG. 7A illustrates one reason for mapping phase state to multiple "pages" of adjustment control words in the look-up table 324: different amounts of adjustment attenuation can be applied as a function of frequency as well as of phase state.

Figure 7B:
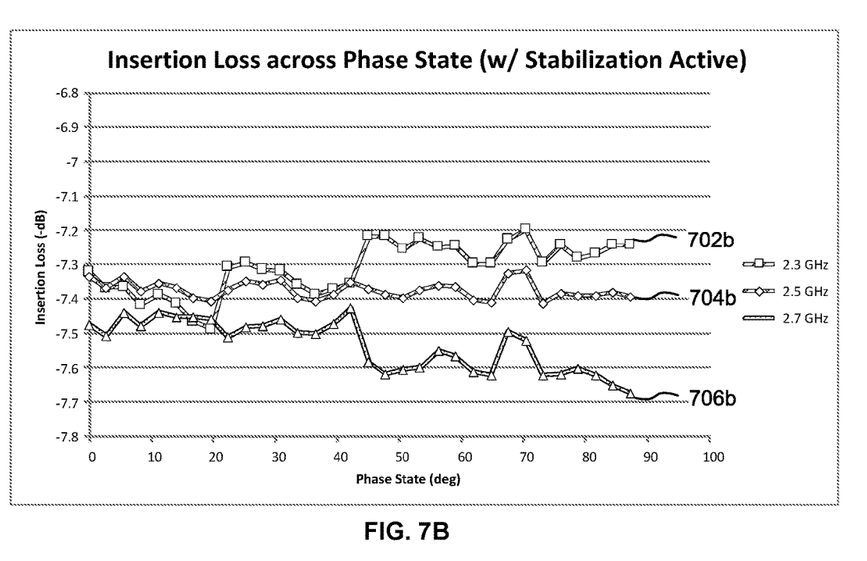
FIG. 7B is a set of graphs for the same simulation of a phase shifter circuit as in FIG. 7A, but showing the post-adjustment variability of attenuation as a function of phase state selection and frequency, illustrating the degree of compensation per phase state applied to equalize insertion loss.

FIG. 7B is a set of graphs for the same simulation of a phase shifter circuit as in FIG. 7A, but showing the post-adjustment variability of attenuation as a function of phase state selection and frequency (graph lines 702*b*, 704*b*, 706*b*), illustrating the degree of compensation per phase state applied to equalize insertion loss. The phase states with lower insertion loss are attenuated to flatten overall insertion loss response across phase state. While variability of insertion loss across all phases states is not eliminated in this example, such variability is substantially reduced compared to the pre-adjustment graphs lines 702*a*, 704*a*, 706*a* shown in FIG. 7A. For example, at 2.5 GHz, the insertion loss across all phase states is within about ±0.05 dB.

Alternative Embodiments & General Adjustment Embodiment

The inventive concepts extend to a number of alternative embodiments. For example, referring to FIG. 3, the serial coupled selectable phase shifter circuit 302, fine adjustment circuit 304, and selectable attenuator circuit 306 can be rearranged into any serial order. Further, the concept of adding fine adjustments to compensate for insertion loss variability as a function of phase state extends to functionally comparable parallel circuit embodiments of the fine adjustment circuit 304.

In addition, the embodiments described above have focused on adjusting signal attenuation to offset variability of insertion loss as a function of phase state. However, the same concepts can be applied to adjusting signal phase to offset phase variability as a function of attenuation state.

That is, attenuation state changes applied to the selectable attenuator circuit 306 may result in changes to the phase of an input signal as various attenuator circuit components are switched in and out of the signal path from RF_In to RF_Out. Accordingly, fine phase adjustment circuits controlled by adjustment control word values mapped to attenuation states may be selectively switched into the signal path to offset such phase variability. The fine phase adjustment circuits may allow positive and/or negative phase shifts. Such fine phase adjustment circuits are a matter of design choice, and may include, for example, one or more inductive components L, capacitive components C, or combination LC phase shifters, including circuits with a combination of active and passive components (such as the digitally tunable capacitor circuits described in U.S. Pat. No. 9,024,700 B2, entitled "Method and Apparatus for Use in Digitally Tuning a Capacitor in an Integrated Circuit Device", issued May 5, 2015, and assigned to the assignee of the present invention, the teachings of which are hereby incorporated by reference). In general, the amount of phase adjustment needed for each attenuation state selection will vary and may be determined empirically during a calibration stage of component manufacture, similar to the method described above for the attenuation fine adjustment circuit 304. However, it is useful to have a fine degree of control over the amount of phase adjustment, and in general the minimum amount of adjustment resolution (i.e., phase step size) should be less than or equal to about 2.8 degrees of phase.

Figure 8:
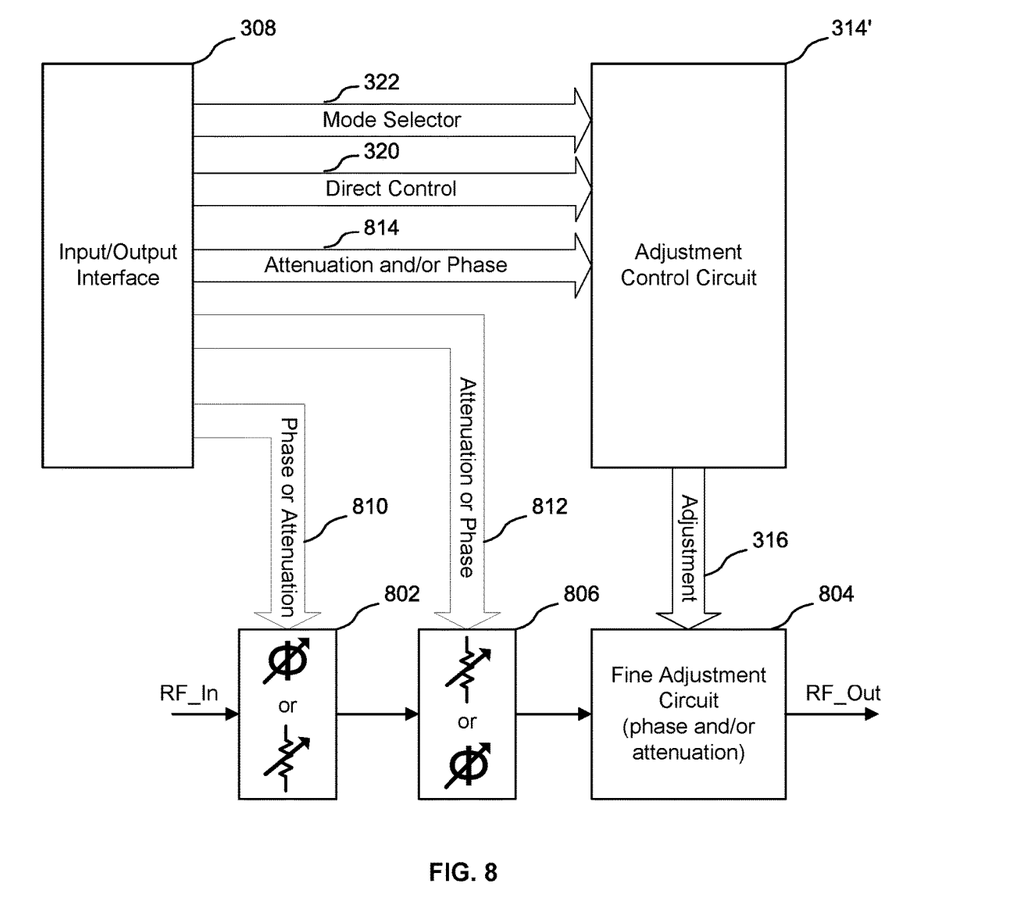
FIG. 8 is a block diagram showing a more general phase and attenuation adjustment embodiment of the invention.

FIG. 8 is a block diagram showing a more general phase and attenuation adjustment embodiment of the invention. A first selectable component 802, which may be a selectable phase shifter circuit or a selectable attenuator circuit, is coupled to an RF signal path between RF_In and RF_Out. A second selectable component 806, which may be a selectable attenuator circuit or a selectable phase shifter circuit (but the opposite function of the first selectable component 802) is also coupled to the RF signal path. A fine adjustment circuit 804 is also coupled to the RF signal path. These three components (802, 804, 806) can be rearranged into any serial order, and functionally comparable parallel circuit embodiments may be substituted.

As in FIG. 3, an input/output interface 308 serves as an interface for communication with external circuitry. Busses 810, 812 from the input/output interface 308 convey state control words to the first selectable component 802 and the second selectable component 806 (either phase or attenuation state control words, as appropriate). Similarly, a bus 814 from the input/output interface 308 conveys phase and/or attenuation state control words to an adjustment control circuit 314', which is also coupled to a mode selector signal line or bus 322. Optionally, a direct control bus 320 may be coupled from the input/output interface block 308 to the adjustment control circuit 314'. In alternative embodiments, these three components (802, 804, 806) may be controlled through completely distinct control interfaces and only "joined", from a control perspective, in software. Thus, there may be multiple circuit blocks that are controlled separately but give the same result.

Similar to the adjustment control circuit 314 of FIG. 3, the adjustment control circuit 314' includes a look-up table that maps particular phase selection control words and/or attenuation selection control words to corresponding adjustment control words. If present, the direct control bus 320 conveys adjustment control words provided by a user's system through the input/output interface 308. The mode selector signal line or bus 322 controls whether the adjustment control circuit 314' outputs mapped adjustment control words or direct adjustment control words.

The fine adjustment circuit 804 receives adjustment control words (mapped or direct) and provides fine tuning of attenuation and/or phase as a function of phase state and/or attenuation state. While shown as one circuit block, the fine adjustment circuit 804 may be implemented as separate attenuation adjustment and phase adjustment circuits. The adjustment control circuit 314' may be implemented with a single look-up table coupled to a combined attenuation/phase fine adjustment circuit 804 or to separate attenuation adjustment and phase adjustment circuits. Alternatively, the adjustment control circuit 314' may be implemented with separate look-up tables for mapping attenuation and phase to adjustment control words, which may be coupled to a combined attenuation/phase fine adjustment circuit 804 or to separate attenuation adjustment and phase adjustment circuits.

As in the other embodiments described above, mapping of phase control words to adjustment control words may be done in several ways, so as to select an amount of attenuation for each phase state in order to substantially equalize insertion loss across all phase states. Similarly, mapping of attenuation control words to adjustment control words may be done in several ways, so as to select an amount of phase adjustment for each attenuation state in order to substantially equalize phase across all attenuation states.

In some embodiments, there may be a need to "skip" unwanted states that for some reason cannot be corrected by fine adjustment (e.g., out of range). Accordingly, for such states, no adjustment is made by the fine adjustment circuit 304. This may be accomplished, for example, by appropriate programming of the look-up table 324 in the adjustment control circuit 314, or by addition of mapping state logic to the adjustment control circuit 314. In doing so, a particular phase or attenuation state would have a relatively increased shift of attenuation or phase (respectively). However, phase monotonicity would be maintained as well as insertion loss or phase flatness, which may be paramount to an application. Such a feature embedded in the adjustment circuitry automates the action and avoids external user programming at the macro system level. The additional complexity is that the adjustment control circuit 314 would play a role in affecting other states.

Methods

Another aspect of the invention includes a method for compensating for variations in insertion loss as phase state changes in a selectable phase shifter circuit, including selecting and applying an amount of attenuation for each phase state so that phase states having better insertion loss are attenuated more than phase states that have worse insertion loss, in order to substantially equalize insertion loss across all phases states.

Another aspect of the above method includes applying a bias level of attenuation to all phase states and selecting an amount of adjustment attenuation for each phase state so as to move pre-adjustment phase state insertion losses closer to a post-adjustment insertion loss target value.

Yet another aspect of the invention includes a method for compensating for variations in phase as attenuation state changes in a selectable attenuator circuit, including selecting and applying an amount of phase shift for each attenuation state in order to substantially equalize phase shift across all attenuation states.

Additional aspects of the above methods include storing adjustment values in a look-up table that maps applied phase and/or attenuation control words to adjustment control words; selectably outputting either mapped adjustment control words or externally-supplied adjustment control words to a fine adjustment circuit that provides fine adjustment of phase and/or attenuation to an applied RF signal; selecting adjustment control words for storing by empirically comparing levels of attenuation or phase shift for each phase state or attenuation state, and storing the adjustment control word for each such state that best achieves a desired level of insertion loss or phase; and selecting and mapping adjustment control words by means of a binary search pattern.

Implementation

As should be readily apparent to one of ordinary skill in the art, various embodiments of the invention can be implemented to meet a wide variety of specifications. Thus, selection of suitable component values are a matter of design choice. Various embodiments of the invention may be implemented in any suitable integrated circuit (IC) technology (including but not limited to MOSFET and IGFET structures), or in hybrid or discrete circuit forms. Integrated circuit embodiments may be fabricated using any suitable substrates and processes, including but not limited to standard bulk silicon, silicon-on-insulator (SOI), silicon-on-sapphire (SOS), GaAs pHEMT, and MESFET processes. Voltage levels may be adjusted or voltage polarities reversed depending on a particular specification and/or implementing technology (e.g., NMOS, PMOS, or CMOS). Component voltage, current, and power handling capabilities may be adapted as needed, for example, by adjusting device sizes, "stacking" components to handle greater voltages, and/or using multiple components in parallel to handle greater currents.

A number of embodiments of the invention have been described. It is to be understood that various modifications may be made without departing from the spirit and scope of the invention. For example, some of the steps and circuits described above may be order independent, and thus can be performed or arranged in an order different from that described. Various activities described with respect to the methods identified above can be executed in repetitive, serial, or parallel fashion. It is to be understood that the foregoing description is intended to illustrate and not to limit the scope of the invention, which is defined by the scope of the following claims, and that other embodiments are within the scope of the claims.

What is claimed is:

1. An electronic circuit for modifying an applied radio frequency, including:
   (a) at least one of (1) a phase shifter circuit for modifying the phase of the applied radio frequency signal in response to applied phase state digital control words, and (2) an attenuator circuit for selectively attenuating the applied radio frequency signal in response to applied attenuation state digital control words;
   (b) a fine adjustment circuit coupled to at least one of the phase shifter circuit and the attenuator circuit, the fine adjustment circuit including at least one of (1) an adjustment attenuator circuit for providing a selectable attenuation adjustment as a function of the applied phase state digital control words to substantially equalize insertion loss variations between phase states selected by the applied phase state digital control words, and (2) an adjustment phase shifter circuit for providing a selectable phase shift adjustment as a function of the applied attenuation state digital control words to substantially equalize phase variations between attenuation states selected by the applied attenuation digital control words; and
   (c) an adjustment control circuit coupled to the fine adjustment circuit, wherein the adjustment control circuit includes a look-up table that maps at least one of the applied phase state digital control words or the applied attenuation state digital control words to at least one set of adjustment digital control words, and wherein at least one set of the adjustment digital control words is coupled to the fine adjustment circuit.

2. The invention of claim 1, wherein the adjustment control circuit is coupled to an external source of adjustment digital control words, and further includes a multiplexer for selectably applying adjustment digital control words to the fine adjustment circuit from one of the look-up table or the external source of adjustment digital control words.

3. The invention of claim 1, wherein the look-up table includes multiple pages of memory locations, each of which maps at least one of the applied phase state digital control words or the applied attenuation state digital control words to a separate set of adjustment digital control words.

4. The invention of claim 1, wherein at least one of the at least one attenuator circuit includes a plurality of selectable attenuator circuits for providing selectable attenuation as a function of the applied phase state digital control words.

5. The invention of claim 1, wherein at least one of the at least one phase shifter circuit includes a plurality of selectable phase shifter circuits for providing selectable phase shift adjustment as a function of the applied attenuation digital control words.

6. The invention of claim 1, wherein the step size of the attenuation adjustment provided by the adjustment attenuator circuit is less than about 0.5 dB.

7. The invention of claim 1, wherein the step size of the phase shift provided by the adjustment phase shifter circuit is less than or equal to about 2.5 degrees of phase.

8. An electronic circuit for modifying an applied radio frequency, including:
   (a) at least one phase shifter circuit for modifying the phase of the applied radio frequency signal in response to applied phase state digital control words; and
   (b) a fine adjustment circuit coupled to at least one of the at least one phase shifter circuit, the fine adjustment circuit including at least one attenuator circuit for providing a selectable attenuation adjustment as a function of the applied phase state digital control words to substantially equalize insertion loss variations between phase states selected by the applied phase state digital control words; and
   (c) an adjustment control circuit coupled to the fine adjustment circuit, wherein the adjustment control circuit includes a look-up table that maps the applied phase state digital control words to at least one set of adjustment digital control words, and wherein at least one set of the adjustment digital control words is coupled to the fine adjustment circuit.

9. The invention of claim 8, wherein the adjustment control circuit is coupled to an external source of adjustment digital control words, and further includes a multiplexer for selectably applying adjustment digital control words to the fine adjustment circuit from one of the look-up table or the external source of adjustment digital control words.

10. The invention of claim 8, wherein the look-up table includes multiple pages of memory locations, each of which maps the applied phase state digital control words to a separate set of adjustment digital control words.

11. The invention of claim 8, wherein at least one of the at least one attenuator circuit includes a plurality of selectable attenuator circuits for providing selectable attenuation as a function of the applied phase state digital control words.

12. The invention of claim 8, further including at least one attenuator circuit, coupled to the adjustment control circuit, for selectively attenuating the applied radio frequency signal in response to applied attenuation state digital control words.

13. The invention of claim 8, wherein the step size of the attenuation adjustment provided by the fine adjustment circuit is less than about 0.5 dB.

14. An electronic circuit for modifying an applied radio frequency, including:
   (a) at least one attenuator circuit for selectively attenuating the applied radio frequency signal in response to applied attenuation state digital control words; and
   (b) a fine adjustment circuit coupled to at least one of the at least one attenuator circuit, the fine adjustment circuit including at least one phase shifter circuit for providing a selectable phase shift adjustment as a function of the applied attenuation state digital control words to substantially equalize phase variations between attenuation states selected by the applied attenuation digital control words; and
   (c) an adjustment control circuit coupled to the fine adjustment circuit, wherein the adjustment control circuit includes a look-up table that maps the applied attenuation state digital control words to at least one set of adjustment digital control words, and wherein at least one set of the adjustment digital control words is coupled to the fine adjustment circuit.

15. The invention of claim 14, wherein the adjustment control circuit is coupled to an external source of adjustment digital control words, and further includes a multiplexer for selectably applying adjustment digital control words to the fine adjustment circuit from one of the look-up table or the external source of adjustment digital control words.

16. The invention of claim 14, wherein the look-up table includes multiple pages of memory locations, each of which maps the applied attenuation state digital control words to a separate set of adjustment digital control words.

17. The invention of claim 14, wherein at least one of the at least one phase shifter circuit includes a plurality of selectable phase shifter circuits for providing selectable phase shift adjustment as a function of the applied attenuation state digital control words.

18. The invention of claim 14, further including at least one phase shifter circuit, coupled to the adjustment control circuit, for modifying the phase of the applied radio frequency signal in response to applied phase state digital control words.

19. The invention of claim 14, wherein the step size of the phase shift adjustment provided by the fine adjustment circuit is less than or equal to about 2.5 degrees of phase.

* * * * *